Jan. 19, 1971 KYONGMIN KIM 3,556,842

METHOD OF PRODUCING LAYERS OF INTERMETALLIC SUPERCONDUCTING NIOBIUM-TIN ($Nb_3Sn$) ON A CARRIER

Filed March 15, 1968 2 Sheets-Sheet 1

United States Patent Office 3,556,842

Patented Jan. 19, 1971

3,556,842

METHOD OF PRODUCING LAYERS IF INTERMETALLIC SUPERCONDUCTING NIOBIUM-TIN ($Nb_3Sn$) ON A CARRIER

Kyongmin Kim, Halifax, Nova Scotia, Canada, assignor to Siemens Aktiengesellschaft, a corporation of Germany Filed Mar. 15, 1968, Ser. No. 713,344
Claims priority, application Germany, Mar. 16, 1967, S 108,857
Int. Cl. C23c *11/00, 13/00*
U.S. Cl. 117—217 5 Claims

ABSTRACT OF THE DISCLOSURE

Described is a method of producing layers from the intermetallic superconducting niobium-tin ($Nb_3Sn$) upon a carrier comprised of highly refractory metal or of a highly refractory metal alloy, by reducing the halides of niobium and tin, by hydrogen upon the heated carrier. The process is characterized by first bringing a gaseous niobium chloride or bromide and hydrogen into contact with a heated carrier thereby precipitating, upon said carrier, a niobium layer through a reduction of the niobium chloride or niobium bromide and, thereafter, precipitating a niobium-tin layer upon said niobium layer.

My invention relates to a method of producing layers of intermetallic, superconducting niobium-tin ($Nb_3Sn$) upon a carrier of a highly refractory metal or a highly refractory metal alloy, by reducing halides of niobium and tin by means of hydrogen, on a heated carrier.

Methods for producing layers of niobium-tin ($Nb_3Sn$) on a carrier, by reduction with hydrogen of the chlorides of niobium and tin upon a heated carrier, are known per se; see, for example, the treatise by Hanak, Strater and Cullen in "RCA Review" of September 1964, pp. 342–365. They are particularly suitable for the production of superconducting wires and tapes which, for example, can be used for superconducting magnet coils to produce magnetic fields. Tapes of highly refractory alloys are used as carriers in connection therewith. For example tape of a nickel base alloy, known under the trade name "Hastelloy," has been used as the carrier.

More intensive tests have shown that during the precipitation of the niobium-tin layer a reaction zone frequently forms between the carrier and the niobium-tin layer. This reaction zone comprised of intermetallic compounds of nickel and tin is approximately 1 to 4$\mu$ thick. The intermetallic reaction zone reduces the cross section of the superconducting niobium-tin layer in an unpredictable way. The reaction zone, under certain circumstances, also has an unfavorable influence upon the adherence properties of the niobium-tin layer and upon the electrical stabilization effect of the carrier for the superconducting layer. The critical current density of the superconducting wire or tape is, in any case, reduced by said reaction zone, with regard to the total cross section of the wire or the tape. High critical current densities, however, are very much desired in superconducting wires and tapes and other superconducting structural components. By "critical current density" is meant the current density at which, in a given magnet field, the superconductor passes from a superconductor passes from a superconducting into a normal electrically conducting state. Furthermore, the known methods entail the danger that, during the precipitation process, nickel or other components of the metallic carrier will diffuse into the $Nb_3Sn$ layer and will thus considerably impair the superconducting properties of said layer.

The present invention has as its object to devise a method for producing layers of intermetallic, superconducting niobium-tin ($Nb_3Sn$) upon a carrier of highly refractory metal or a highly refractory metal alloy, by reducing the halides of niobium and tin by hydrogen upon a heated carrier, while obviating the aforementioned disadvantages. This object is achieved by first passing a gaseous mixture of niobium chloride or niobium bromide and hydrogen into contact with the heated carrier and precipitating a niobium layer upon said carrier, by reduction of the niobium chloride or niobium bromide. The niobium-tin layer is then precipitated upon the niobium layer.

The reaction sluggishness of niobium in the precipitated intermediate niobium layer of the present invention prevents the formation of a reaction zone between the carrier and the niobium tin layer and thus prevents the indiffusion of components of the carrier into the niobium-tin layer.

The niobium-tin layer grows uniformly in accordance with the present invention on the niobium layer, adheres tightly to the base and shows no tears whatsoever. This is a surprising and completely unexpected result. According to the prior art one had to expect that a niobium-tin layer would grow very poorly upon niobium and would show strong tears. This is described in the aforementioned article appearing in the "RCA Review," in connection with a tantalum wire coated with niobium tin, whereby during the coating process free niobium from a mixture of niobium and tin chlorides was inadvertently first precipitated on the tantalum carrier.

My method is used to advantage for coating carriers of all highly refractory metal alloys or metals, whose components form a reaction zone with the niobium-tin layer or diffuse into the niobium-tin layer. This relates particularly to alloys containing the elements nickel, molybdenum, chromium or cobalt and which are also considered to be "special steel."

The coating of wire of tape-shaped carriers is preferably so effected that the carrier is first passed through a first coating chamber in which the niobium layer is precipitated and thereafter passes through a second coating chamber in which the niobium-tin layer is precipitated upon the niobium layer. This mode of operation is particularly suitable for a continuous coating of very long wires or tapes.

Another way of performing the method of my invention is to arrange the carrier in a coating chamber and to introduce gaseous niobium chloride into the coating chamber to form the niobium layer by reducing the gaseous niobium chloride by hydrogen at the heated carrier. Gaseous tin chloride, in addition to the niobium chloride, is then introduced into the coating chamber and the niobium-tin layer is precipitated upon the niobium layer. This embodiment of the method, according to which the entire coating process is executed in a coating chamber, is especially favorable in the production of individual, superconducting components, for example of sheets with niobium-tin layers, or of hollow cylinders with niobium-tin layers which may be used for shielding or for trapping of magnetic fields.

The niobium layer should not be very thick since it fulfills, essentially, the function of a protection layer. It is most advantageous that the niobium layer is precipitated upon the carrier in a thickness of approximately 1 to 3$\mu$.

The percipitation of the niobium layer may also be effected through reduction of niobium pentachloride ($NbCl_5$) or through reduction of niobium tetrachloride ($NbCl_4$). Further, the prevent the precipitation of the disturbing niobium trichloride ($NbCl_3$) which forms by disproportion at the walls of the coating chamber, the gaseous niobium tetrachloride may partially be converted, prior to its introduction into the coating chamber, into niobium pentachloride through an admixture of chlorine gas, as has already been suggested in U.S. application Ser. No. 652,763. Niobium pentabromide ($NbBr_5$) and niobium tetrabromide ($NbBr_4$) are also suitable.

The temperature of the carrier during the coating process should be approximately between 800 and 1100° C. and preferably between 900 and 1000° C. The wall of the coating chamber, which should have a lower temperature than the carrier, may be heated to about 600 to 800° C., and preferably to 630 to 750° C.

The present invention will be described in greater detail by referring to two embodiment examples in conjunction with the drawing in which.

Figure 1:
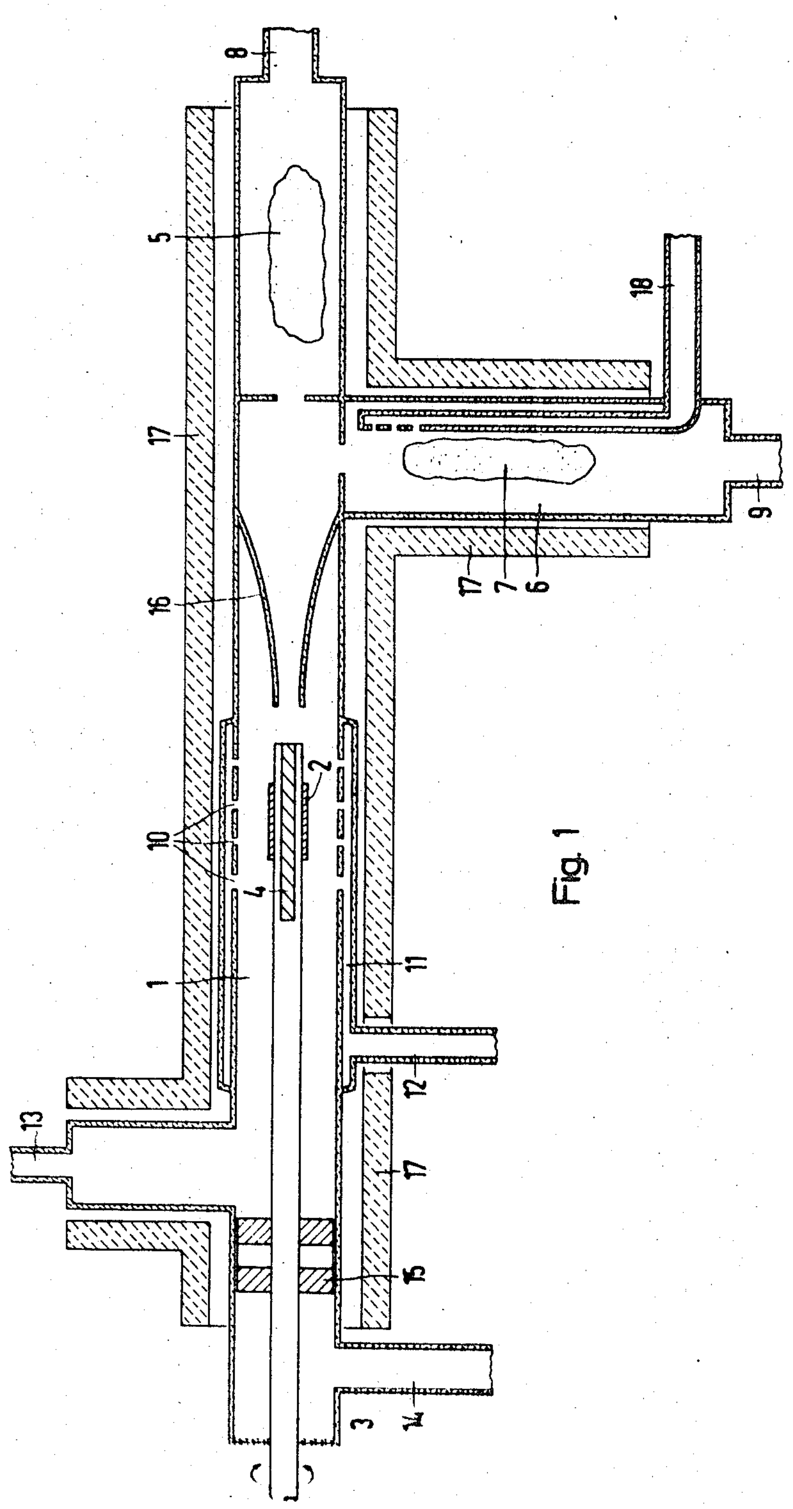
FIG. 1 shows schematically a device used for coating metallic hollow cylinders employing the method of the present invention.

In the device of FIG. 1, quartz tube 1 serves as the coating chamber. The hollow cylinder 2, which is to be coated, is mounted upon a rotatable shaft 3 and installed into the quartz tube 1. A heating device 4 is positioned at the end of the shaft 3 which carries the hollow cylinder. One end of the tube 1 holds the supply of tin 5 and when the device is in operation, serves as the tin chlorinator.

A lateral tube extension 6 hold the niobium supply 7 and during the operation of the device serves as the niobium chlorinator. The chlorides of niobium and tin are formed by passing chlorine gas through the tube nozzles 8 and 9 across the supply of tin 5, and across the supply of niobium 7, respectively. The wall of the quartz tube 1 is provided with openings 10 in the vicinity of the cylinder 2 which is to be coated. These openings 10 end in another quartz tube 11 which envelops a portion of quartz tube 1. The quartz tube 11 is equipped with a tube nozzle 12 which serves for the supply of the hydrogen. The quartz tube 1 also has a nozzle 13 which serves as an outlet for the exhaust gas and another nozzle 14 to supply protective gas. Escape of the reaction gases from the immediate coating chamber can be prevented by the protective gas which is introduced into the tube nozzle 14 and by the sealing element 15, installed in the quartz tube 1, which is provided with a nozzle-type quartz portion 16 which concentrates the gaseous chlorides of the niobium and the tin concentrate upon the carrier 2. The quartz tube 1, as well as both chlorinators, are preferably surrounded by hinged tubular furnaces 17.

The following example describes the coating of a hollow cylinder which is comprised of an alloy, known by the trade name "Hastelloy Alloy B" (DIN designation $NiMo_3O$). This alloy contains approximately 62% nickel, 26 to 30% molybdenum, and the remainder is comprised of small amounts of cobalt, silicon, manganese, iron, carbon and vanadium.

The hollow cylinder 2 on shaft 3 is first installed into the quartz tube 1. Thereafter the original materials niobium 7 and tin 5 are introduced into the niobium and tin chlorinators, respectively. The tubular furnace 17 is used to heat the wall of the coating chamber 1 to about 630 to 750° C., the wall of the niobium chlorinator 6 to about 950° C. and the tin chlorinator to about 800° C. The hollow cylinder 2 is heated to a temperature of approximately 950° C. by means of the heater 4. After removing the air from the device, for example by introducing hydrogen or an inert gas such as argon or helium, chlorine gas is passed into the niobium chlorinator 6 via the nozzle 9. Gaseous niobium tetrachloride forms when the chlorine gas is passed across the heated niobium 7. The gaseous niobium tetrachloride flows through the nozzle 16, across the hollow cylinder 2, on which it is reduced by the hydrogen introduced into the coating chamber through the tube nozzle 12, via pipe or tube 11 and the openings 10. At a flow rate of chlorine gas, amounting to 3 l./h. and a hydrogen flow rate of 10 l./h., with an addition of 2 l./h. of hydrogen chloride gas, a niobium layer of 2 to 3$\mu$ in thickness was precipitated in approximately 5 minutes on the cylinder 2, which was about 60 mm. long and had a diameter of 16 mm. The coating chamber was about 40 cm. long and had a diameter of approximately 4 cm. Following the precipitation of this niobium layer, chlorine gas was passed over the heated tin supply 5 via the nozzle 8 to form the niobium-tin layer. Gaseous tin dichloride, formed thereby, flows together with the niobium tetrachloride through the nozzle 16, into the coating chamber, wherein both chlorides are now reduced.

At a flow rate of 8 l./h. of chlorine gas through the tube nozzle 8, a 50$\mu$ thick $Nb_3Sn$ layer grew in about 30 minutes on the cylinder 2, already coated with niobium. The niobium-tin layer adhered extremely tight to the niobium base and had a completely uniform structure. Its critical current density, in a magnetic field of 50 kilooersted was $5 \cdot 10^5$ a./cm.$^2$.

As a result of supplying chlorine gas through the pipe 18, the niobium tetrachloride, formed in the niobium chlorinator 6, may be converted completely or partly into niobium pentachloride. The amount of chlorine gas introduced through the pipe 18 is preferably so chosen that it amounts to approximately 10 to 20% of the chlorine gas introduced through the nozzle 9.

Figure 2:
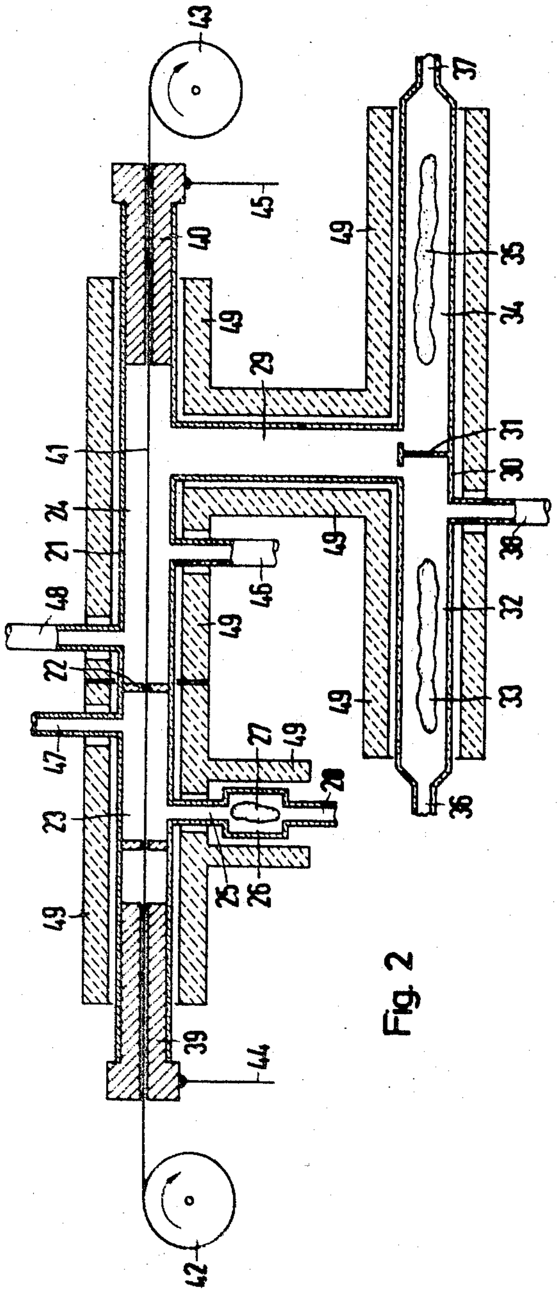
FIG. 2 shows schematically a device used to coat a band-shaped carrier utilizing the method of the present invention.

Another embodiment example will describe more explicitly by referring to FIG. 2 the production of a niobium-tin layer on a band of "Hastelloy Alloy B."

To precipitate the niobium-tin layer, the device of FIG. 2 employs a quartz tube 21 which is divided by a graphite sealing disc 22 into a first coating chamber 23 and a second coating chamber 24. The coating chamber 23 is connected via pipe 25 with chamber 26, into which the initial material 27 for the niobium chloride, needed to precipitate the niobium layer, may be inserted. Gas may be introduced into the chamber 26, via the nozzle 28. The second coating chamber 24 is connected, via a quartz tube 29, with another quartz tube 30 which is divided by quartz wall 31. One portion 32 of the tube 30 holds the supply of niobium 33 and during the operation of the device serves as a niobium chlorinator, while the other portion 34 of the pipe 30 holds the supply of tin 35 and during the operation of the device serves as the tin chlorinator. Both ends of tube 30 are provided with nozzles 36 and 37. Behind the niobium supply 33, another nozzle 38 is installed at portion 32 of the pipe 30. The quartz wall 31 prevents the flow-in of gas from the portion 32 of the pipe 30 in portion 34 and vice versa. Both ends of quartz tube 21 are sealed with graphite bodies 39 and 40 which are provided with an opening as small as possible for passing through the tape-like carrier 41. The carrier 41 is unwound from the roll 42 and is picked up on rewind roll 43 driven by a motor. The carrier 41 maintains a conductive connection with graphite bodies 39 and 40, which are connected to an electric current source, via conductors 44 and 45. Nozzle 46 is used to introduce hydrogen into the second coating chamber 24. The exhaust gases occurring during the coating process are removed from coating chambers 23 and 24 by nozzles 47 and 48. The quartz tubes 21, 29 and 30, as well as the chamber 26, are surrounded by appropriately formed, for example hinged, tubular furnaces 49 which help to heat the individual parts of the device.

For the purpose of coating the "Hastelloy Alloy B" tape, a supply 27 of niobium pentachloride is inserted into the chamber 26, a niobium supply 33 into the niobium chlorinator 32 and a tin supply 35 into the tin chlorinator 34. The tape 41, to be coated, is installed in an appropriate manner into the quartz tube 21 and pulled through the tube at a constant speed. Electric current is passed, via leads 44 and 45, through the tape 41 and the current is so measured that the tape or band will be heated to approximately 900 to 1000° C. The tubular furnaces 49 heat the wall of the first coating chamber 23 to approximately 650° C., the wall of the second coating chamber 24 to approximately 700° C., the niobium pentachloride supply 27 to about 205° C., the niobium chlorinator 32 to approximately 900° C., the tin chlorinator 34 to approximately 800° C. and, to prevent a condensation of the chlorides, the pipe 29 to approximately 650° C. After introducing inert gas to force the air from the device, hydrogen is introduced into the chamber 26, through pipe nozzle 28 to precipitate the niobium layer on the band 41. The niobium pentachloride 27 located in this chamber is slightly above the melting point, at a temperature of 205° C. The equilibrium vapor pressure of the gaseous niobium pentachloride at this temperature amounts to 0.3 atm. Through the flowing-in hydrogen, the gaseous niobium pentachloride is introduced into the first coating chamber 23 and is reduced therein, at the heated band 41, by hydrogen, to precipitate a niobium layer upon the band 41. The free enthalpy of the corresponding reaction.

$$NbCl_5+\tfrac{5}{2}H_2\rightleftharpoons Nb+5HCl$$

amounts to +10 kilocal./mol at 650° C. and to −2.5 kilocal./mol at 900° C. The yield of the niobium precipitation increases with a rise in temperature. The released niobium is thus not precipitated, for all practical purposes, at the wall of the first coating chamber 23, which is heated to about 650° C., but upon the tape 41. The band which was coated in the coating chamber 23 with a layer of niobium, is further transported into the coating chamber 24 and there is coated with a niobium-tin layer. In addition, chlorine gas is introduced into the niobium chlorinator 32, via pipe nozzle 36. The chlorine gas enters the tin chlorinator 34, via the pipe nozzle 37. While passing the chlorine gas across the heated niobium 33, gaseous niobium tetrachloride is formed, while gaseous tin chloride develops during the passage of chlorine gas across the molten tin 35. Furthermore, chlorine gas may be introduced into the niobium chlorinator 32, via the pipe nozzle 38, behind the niobium supply 33. The chlorine gas serves to effect a partial conversion of the niobium tetrachloride into niobium pentachloride. The gaseous chlorides of niobium and of tin stream through the pipe 29 into the coating chamber 24. At the same time, the coating chamber 24 is being supplied, via the pipe nozzle 46, with hydrogen to which hydrogen chloride has been added. The hydrogen reduces the chlorides of niobium and tin at the heated band 41 to coat the latter with a $Nb_3Sn$ layer. The coated band is drawn from the quartz tube 1 and is wound up upon motor-driven roller 43.

The amount of gas required during this continuous process, per time unit, depends upon the condition of the chlorination and reduction. The temperatures in the individual parts of the device and the dimensions of said device can be adjusted to the flow rate velocity of the tape-shaped carrier, as well as to the desired thickness of the niobium-tin layer to be produced on the carrier. In the present example, the chamber 26 was about 5 cm., the niobium chlorinator 32 and the tin chlorinator 34 were, each, about 40 cm. long with the pipe 29 about 20 cm. long. The length of the first coating chamber 23 was about 10 cm., the length of the second coating chamber 24 was about 30 cm. The pipes 21, 29, 30 and the chamber 26, furthermore, all had the same diameter of about 4 cm. The hydrogen flow rate through the chamber 26 was about 2 l./h., the chlorine flow rate through the niobium chlorinator 32 was about 4 l./h., and the chlorine gas rate of flow through the tin chlorinator 34 was about 8 l./h. The amount of chlorine gas introduced through the pipe nozzle 38, per time unit, was approximately 0.5 l./h., i.e. about 12.5% of the chlorine gas introduced through the pipe nozzle 36. To reduce the chlorines in the second coating chamber 24, about 10 l./h. hydrogen were consumed. About 2 l./h. hydrogen chloride gas was added to the hydrogen. The tape 41, which was 50$\mu$ thick and 0.2 cm. wide, was pulled through the tube 21, at a velocity of approximately 3 mm./sec. The niobium layer which was precipitated on the band in the first coating chamber 23 had a thickness of about 2$\mu$, with the niobium-tin layer precipitated in the second coating chamber 24, upon said niobium layer, having a thickness of about 8$\mu$.

In a similar manner, niobium bromide may be introduced into coating chamber 23, to precipitate the niobium layer. Also, during the subsequent precipitation of the niobium-tin layer, one may start with niobium and tin bromides.

Figure 3:
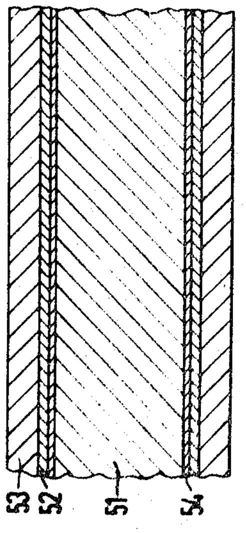
FIG. 3 shows schematically a section of a band coated in accordance with the method of the present invention.

The coated layer is shown schematically, in section, in FIG. 3. The "Hastelloy Alloy B" carrier is denoted as 51, the niobium layer with 52 and the niobium-tin layer is 53. At the surface of the carrier 51 is a thin diffusion seam 54 which, however, has no adverse effect. The adherence of the layers to the carrier is excellent. The homogeneity of the layers was examined by means of X-ray tests and tests concerning the strata temperature. The X-ray picture showed no foreign lines whatsoever, which could have pointed to a reaction between the material of the carrier 51 and the niobium-tin layer 53. Examination of the strata temperature, at which the niobium-tin layer 53 was removed layer by layer, showed uniform critical temperature values over the entire layer thickness. In a band produced in accordance with the method of the present invention, a critical current of more than 250 a. was measured in a magnetic field of 80 kilo-oersted. On the other hand, a band produced under the same conditions, but without a niobium layer, had, by contrast, in a magnetic field of 80 kilo-oersted, a critical current of only about 210 a. This shows that a considerable increase in the critical current is obtained with the method of the present invention.

In addition to the production of niobium-tin layers, the method of the present invention may also be employed in the production of layers comprised of other intermetallic superconducting compounds, through a reduction of the halides of the compounds, by means of hydrogen.

I claim:

1. The method of producing layers from the intermetallic superconducting niobium-tin ($Nb_3Sn$) upon a carrier comprised of highly refractory metal by reducing the halides of niobium and tin, with hydrogen upon the heated carrier, which comprises first contacting a heated carrier with gaseous niobium halogen selected from chloride and bromide together with hydrogen and precipitating, upon said carrier, a niobium layer by reduction of the niobium halogen and, thereafter, precipitating a niobium-tin layer upon said niobium layer.

2. The method of claim 1, wherein a wire or band-shaped carrier is passed through a first coating chamber wherein the precipitation of the niobium layer takes place and is subsequently passed through a second coating chamber wherein the niobium-tin layer is precipitated upon said niobium layer.

3. The method of claim 1, wherein the carrier is arranged in a coating chamber, gaseous niobium chloride is introduced into said coating chamber, said gaseous niobium chloride is reduced at the heated carrier by means of hydrogen to form a niobium layer, subsequently gaseous tin chloride is introduced into the coating chamber in addition to the niobium chloride, and said tin and niobium chloride are reduced by hydrogen to form a niobium-tin layer upon the niobium layer.

4. The method of claim 1, wherein the niobium layer, precipitated upon the carrier, is approximately 1 to 3$\mu$ thick.

5. The method of producing layers from the intermetallic superconducting niobium-tin ($Nb_3Sn$) upon a carrier comprised of high refractory metal by reducing the halides of niobium and tin, with hydrogen upon the heated carrier, which comprises first contacting a heated carrier alloy which contains a plurality of the metals nickel, molybdenum, chromium and cobalt, with gaseous niobium halogen selected from chloride and bromide together with hydrogen and precipitating, upon said carrier, a niobium layer by reduction of the niobium halogen and, thereafter, precipitating a niobium-tin layer upon said niobium layer.

References Cited

UNITED STATES PATENTS

| | | | |
|---|---|---|---|
| 3,420,707 | 1/1969 | Hanak | 117—107.2X |
| 3,449,092 | 6/1969 | Hammond | 117—217X |

WILLIAM L. JARVIS, Primary Examiner

U.S. Cl. X.R.

117—107.2, 230